(12) United States Patent
Vampola et al.

(10) Patent No.: US 10,205,063 B2
(45) Date of Patent: Feb. 12, 2019

(54) WAVELENGTH CONVERTED SEMICONDUCTOR LIGHT EMITTING DEVICE

(71) Applicant: Lumileds LLC, San Jose, CA (US)

(72) Inventors: Kenneth Vampola, San Jose, CA (US); Floris Crompvoets, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/533,158

(22) PCT Filed: Dec. 8, 2015

(86) PCT No.: PCT/US2015/064527
§ 371 (c)(1),
(2) Date: Jun. 5, 2017

(87) PCT Pub. No.: WO2016/094422
PCT Pub. Date: Jun. 16, 2016

(65) Prior Publication Data
US 2017/0365746 A1    Dec. 21, 2017

Related U.S. Application Data

(60) Provisional application No. 62/088,834, filed on Dec. 8, 2014.

(51) Int. Cl.
*H01L 33/46*  (2010.01)
*H01L 33/50*  (2010.01)
(Continued)

(52) U.S. Cl.
CPC ............. *H01L 33/46* (2013.01); *H01L 27/15* (2013.01); *H01L 33/505* (2013.01); *H01L 33/58* (2013.01);
(Continued)

(58) Field of Classification Search
CPC combination set(s) only.
See application file for complete search history.

(56) References Cited

U.S. PATENT DOCUMENTS

2010/0264438 A1   10/2010  Suenaga
2012/0211774 A1*   8/2012  Harada ................... H01L 33/56
                                                              257/88

(Continued)

FOREIGN PATENT DOCUMENTS

EP    2216834 A1    8/2010

OTHER PUBLICATIONS

EPO as ISA, "International Search Report and Written Opinion" dated Mar. 3, 2016 from International Application No. PCT/US2015/064527, filed Dec. 8, 2015, 14 pages.

*Primary Examiner* — Ratisha Mehta
(74) *Attorney, Agent, or Firm* — Volpe and Koenig, P.C.

(57) ABSTRACT

In some embodiments of the invention, a device includes a semiconductor light emitting device having a first light extraction surface, a wavelength converting element, and a second light extraction surface. A majority of light extracted from the semiconductor light emitting device is extracted from the first light extraction surface. The first light extraction surface has a first area. The second light extraction surface is disposed over the first light extraction surface and has a second area. The first area is larger than the second area.

13 Claims, 3 Drawing Sheets

(51) Int. Cl.
  *H01L 33/58*  (2010.01)
  *H01L 27/15*  (2006.01)
  *H01L 33/54*  (2010.01)
  *H01L 33/56*  (2010.01)

(52) U.S. Cl.
  CPC ............ *H01L 33/508* (2013.01); *H01L 33/54* (2013.01); *H01L 33/56* (2013.01); *H01L 2924/0002* (2013.01); *H01L 2933/0091* (2013.01)

(56) References Cited

U.S. PATENT DOCUMENTS

2015/0049502 A1* 2/2015 Brandl .................... H01L 27/15
                                                      362/510
2015/0325757 A1* 11/2015 Shuhei ................. H01L 33/505
                                                       257/98

\* cited by examiner

WAVELENGTH CONVERTED SEMICONDUCTOR LIGHT EMITTING DEVICE

CROSS-REFERENCE TO RELATED APPLICATIONS

The present application is a § 371 application of International Application No. PCT/US2015/064527 filed on Dec. 8, 2015 and entitled "WAVELENGTH CONVERTED SEMICONDUCTOR LIGHT EMITTING DEVICE", which claims the benefit of U.S. Provisional Patent Application No. 62/088,834, filed Dec. 8, 2014. International Application No. PCT/US2015/064527 and U.S. Provisional Patent Application No. 62/088,834 are incorporated herein.

FIELD OF THE INVENTION

The present invention relates to a semiconductor light emitting device with increased luminance.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

SUMMARY

It is an object of the invention to provide a wavelength converted light emitting device with increased luminance.

In some embodiments of the invention, a device includes a light emitting device having a first light extraction surface, a wavelength converting element, and a second light extraction surface. A majority of light extracted from the light emitting device is extracted from the first light extraction surface. The first light extraction surface has a first area. The second light extraction surface is disposed over the first light extraction surface and has a second area. The first area is larger than the second area.

In some embodiments of the invention, a device includes a plurality of light emitting devices each having a first light extraction surface. A majority of light extracted from each of the light emitting devices is extracted from the first light extraction surfaces. A wavelength converting element is disposed over at least two of the first light extraction surfaces. The wavelength converting element has a second light extraction surface. The area of the second light extraction surface is smaller than an area that is the sum of the areas of each of the first light extraction surfaces in the plurality.

DETAILED DESCRIPTION

Some lighting applications require sources with high luminance or high illuminance. Luminance is luminous flux per unit area, per solid angle. Luminance is usually expressed in the units [$cd/m^2$], or [$lm/sr/m^2$]. Illuminance is the luminous flux per unit area. Illuminance is usually expressed in the units [$lm/m^2$]. Illuminance measures the light emitted from an area, while luminance measures light that is not only confined to a certain area, but also confined to a set of angles. In embodiments of the invention, the light extraction area of the source is confined, so both luminance and illuminance are changed as compared to an identical device without a confined light extraction area. Because the structures described in some embodiments do not usually change the angles of emission, the fractional change to luminance and illuminance are the same. High luminance allows for greater beam control, or for smaller and less expensive optics. Some applications where high luminance may be desirable include automotive, flash (for example, as applied to photography), and directional illumination.

In embodiments of the invention, the luminance in a semiconductor light emitting device such as an LED may be increased by reducing the area of the light emitting surface. The light emitting surface of the structure may be reduced by disposing a wavelength converting element over the LED. A light emitting surface area of the wavelength converting element may be smaller than the light emitting surface area of the LED. At least a portion of light extracted from the LED may be forced to exit through the smaller area of the wavelength converting element, which may increase the illuminance and luminance of the structure.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used in embodiments of the invention.

Figure 1:
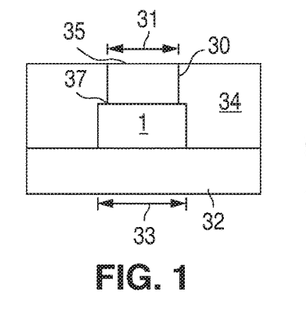
FIG. 1 is a cross sectional view of a device including an LED and a wavelength converting element, according to some embodiments.

FIG. 1 is a cross sectional view of an embodiment of the invention. An LED 1 is disposed on a support 32. One example of an LED 1 is described below in reference to FIG. 2.

Any suitable support 32 may be used. Examples include, for example, a metal core PC board, an insulating substrate such as a ceramic substrate, or a conductive substrate such as a metal substrate. Support 32 may provide electrical connections to power LED 1, as is known in the art. LED 1 is attached to support 32 by any suitable structure including, for example, conductive interconnects, solder, metal interconnects, gold-gold interconnects, or conductive glue. (In the case of a conductive support, electrical isolation to prevent shorting in the LED may be provided on one or more surfaces of the support by one or more insulating layers, as is known in the art.)

Figure 2:
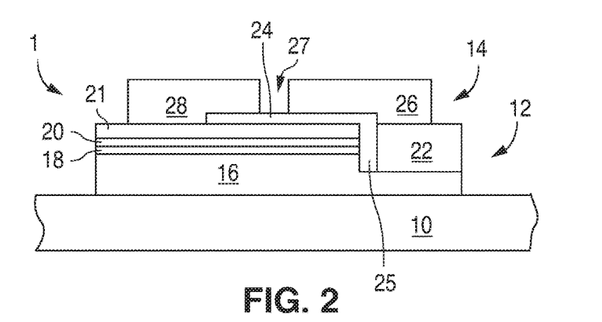
FIG. 2 is a cross sectional view of one example of an LED.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a ill-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

In some embodiments, a transparent region is disposed between the semiconductor structure of the LED and the wavelength converting element, described below. The transparent region may be an empty cavity or a filled region. The transparent region may behave as a mixing box, which recycles light and may increase the likelihood that the light is extracted from the semiconductor structure of the LED and impinges on the wavelength converting element. The transparent region may be the growth substrate 10, as illustrated in the device of FIG. 2. In some embodiments, the growth substrate is removed or thinned and the transparent region is a non-growth substrate material, such as a slab of glass, sapphire, silicone, or any other suitable material. The semiconductor structure of the LED is on the order of microns thick, and the transparent region is on the order of hundred of microns thick. In some embodiments, the transparent region is at least 20 times and no more than 100 times thicker than a thickest part of the semiconductor structure. The transparent region may be omitted in some embodiments, in particular when a diffuse reflector, and/or the wavelength converting element itself, may substitute for a mixing box.

Many individual LEDs are formed on a single wafer then diced from a wafer of devices. The invention is not limited to the particular LED illustrated in FIG. 2; any suitable device may be used. The LEDs are represented in the following figures by block 1.

Returning to FIG. 1, a wavelength converting element 30 is disposed over the LED 1. The wavelength converting element includes one or more wavelength converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. The final spectrum of light extracted from the structure may be white or monochromatic. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, wavelength converting element 30 is a structure that is fabricated separately from LED 1 and attached to LED 1, for example through wafer bonding or a suitable adhesive such as silicone or epoxy. One example of such a pre-fabricated wavelength converting element is a ceramic phosphor, which is formed by, for example, sintering powder phosphor or the precursor materials of phosphor into a ceramic slab, which may then be diced into individual wavelength converting elements. A ceramic phosphor may also be formed by, for example tape casting, where the ceramic is fabricated to the correct shape, with no dicing or cutting necessary. Examples of suitable non-ceramic pre-formed wavelength converting elements include powder phosphors that are disposed in transparent material such as silicone or glass that is rolled, cast, or otherwise formed into a sheet, then singulated into individual wavelength converting elements, and phosphor mixed with silicone and disposed on a transparent substrate. The wavelength converting members may have any suitable cross-section, e.g. square, rectangular, polygonal, hexagonal, circular. The three dimensional shape may include a polyhedron, uniform polyhedral, Johnson solid, prism, anti-prism or any other suitable shape.

A reflective material 34 is disposed on the sides of LED 1 and wavelength converting element 30. The reflective material 34 may be, for example, a diffuse reflector, such as reflective particles such as $TiO_x$ disposed in a transparent material such as silicone, a material reflector such as one or more layers of silver, aluminum, gold, or any other reflective material, a distributed Bragg reflector, or any other suitable structure. Reflective material 34 may be formed by molding and/or pressing over the LED 1 and wavelength converting element 30, or any other suitable technique. Reflective material 34 may be flush with the top surface 35 of wavelength converting element 30 as illustrated in FIG. 1, though this is not required.

Figure 3:
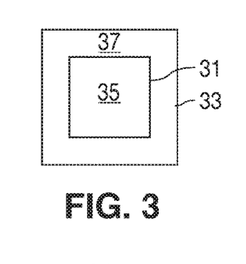
FIG. 3 is a top view of a portion of the device illustrated in FIG. 1, showing the light output surfaces of the LED and the wavelength converting element.

Due to the presence of reflective material 34 along the sidewalls of LED 1 and wavelength converting element 30, a majority of light extracted from LED 1 exits through the top surface 37 of LED 1. A majority of light extracted from wavelength converting element 30 exits through the top surface 35 of wavelength converting element 30. An area 31 of the light extraction surface 35 of wavelength converting element 30 is smaller than an area 33 of the light extraction surface 37 of LED 1, as illustrated in FIG. 3, which is a top view of a portion of the device of FIG. 1.

The light output surface area 31 of the wavelength converting element 30 may be no more than 90% of the light output surface area 33 of LED 1 in some embodiments, no more than 80% in some embodiments, no more than 60% in some embodiments, at least 30% in some embodiments, and at least 50% in some embodiments.

The structure illustrated in FIG. 1 may be formed as follows. LED 1 is formed, as described above in reference to FIG. 2. A wafer of LEDs may be diced into individual or groups of devices. Wavelength converting element 30 is formed. A wafer of wavelength converting elements may be diced into individual wavelength converting elements which correspond to a single LED, or a larger wavelength converting element which corresponds to more than one LED, as described below. LED 1 is attached to support 32, for example by soldering or any other suitable technique. Multiple LEDs may be attached to a wafer of supports 32. Before or after attaching LED 1 to support 32, wavelength converting element 30 may be attached to LED 1, for example by gluing or any other suitable technique. Reflective material 34 is disposed around LED 1 and wavelength converting element 30, for example by molding, pressing, or by any other suitable technique. Excess reflective material, such as, for example, reflective material disposed over the top surface 35 of wavelength converting element 30 after forming the reflective material, may be removed, for example by wet or dry bead blasting, mechanical techniques, or any other suitable technique.

In some embodiments, wavelength converting element 30 is not a pre-formed structure that is attached to LED 1, rather wavelength converting element 30 is formed on LED 1. For example, a layer of reflective material 34 may be disposed over an LED 1 on a support 32. An opening in reflective material 34 may be formed, corresponding to the shape of wavelength converting element 30. A wavelength converting material mixed with a transparent material such as silicone may then be injected or otherwise disposed in the opening, then cured if necessary to form wavelength converting element 30.

The wavelength converting element may have any suitable shape. The wavelength converting element 30 illustrated in FIGS. 1 and 3 is substantially square with substantially vertical sidewalls, and is centered on the LED 1. This is not necessary, as illustrated in FIGS. 4, 5, 6, 7, and 8, which are cross sectional views of alternative embodiments, and FIGS. 9, 10, 11, 12, 13, 14, 15, 16, and 17, which are top views of the light output surfaces of the LED and wavelength converting element in alternative embodiments. The cross sectional views illustrated in FIGS. 1, 4, 5, 6, 7, and 8 may have any of the shapes illustrated in the top views of FIGS. 3, 9, 10, 11, 12, 13, 14, 15, 16, and 17. Similarly, the top views illustrated in FIGS. 3, 9, 10, 11, 12, 13, 14, 15, 16, and 17 may have any of the cross sections illustrated in FIGS. 1, 4, 5, 6, 7, and 8.

Figure 4:
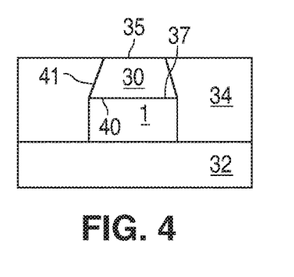
FIGS. 4, 5, 6, 7, and 8 are cross sectional views of devices including LEDs and wavelength converting elements of different shapes, according to some embodiments.

In the device of FIG. 4, the sidewall(s) 41 of wavelength converting element 30 are sloped. The top, light extraction surface 35 of the wavelength converting element 30 is smaller than the bottom surface 40, which is the surface closest to LED 1. Accordingly, sidewall(s) 41 form an acute angle with bottom surface 40. All, a portion, or only one of the sidewall(s) of the wavelength converting element 30 may be angled as illustrated in FIG. 4. The bottom surface 40 of wavelength converting element 30 may be the same size as the light output surface 37 of LED 1, as illustrated in FIG. 4, though this is not required. In particular, the bottom surface 40 of wavelength converting element 30 may be smaller than the light output surface 37 of LED 1.

Figure 5:
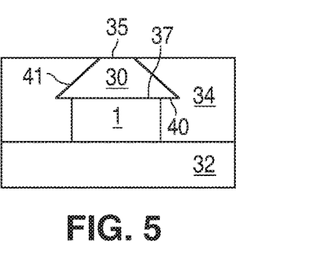

The cross section of the wavelength converting element 30 of the device of FIG. 5 is similar to that of FIG. 4, in that one or more of the sidewall(s) is angled and forms an acute angle with bottom surface 40 such that the light extraction surface 35 is smaller than the bottom surface 40. In the device of FIG. 5, the bottom surface 40 of wavelength converting element 30 is larger than the light output surface 37 of LED 1. Since the light extraction surface 35 of wavelength converting element 30 is smaller than the light output surface 37 of LED 1, the device may still exhibit increased luminance, as compared to a device where the areas of the light output surfaces of the LED and the wavelength converting element are the same.

Figure 6:
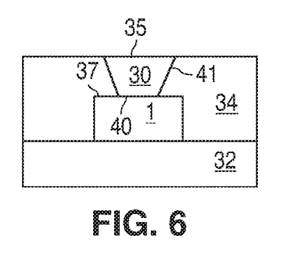

In the device of FIG. 6, the sidewall(s) 41 of wavelength converting element 30 are sloped opposite the device illustrated in FIGS. 4 and 5. In particular, the top, light extraction surface 35 of the wavelength converting element 30 is larger than the bottom surface 40, which is the surface closest to LED 1. Accordingly, sidewall(s) 41 form an acute angle with light extraction surface 35. All, a portion, or only one of the sidewall(s) of the wavelength converting element 30 may be angled as illustrated in FIG. 6. Both the bottom surface 40 and the top, light extraction surface 35 of wavelength converting element 30 are smaller than the light output surface 37 of LED 1.

Figure 7:
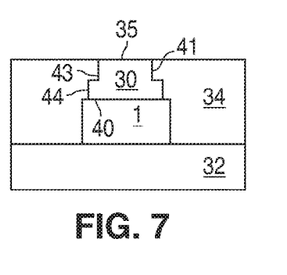
Figure 8:
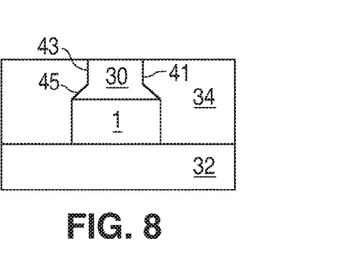

In the devices of FIGS. 7 and 8, the sidewall(s) of the wavelength converting element 30 are divided into more than one section, where the different sections have different profiles. In the device of FIG. 7, a bottom portion 44 of the wavelength converting element 30 is wider then a top portion 43 of the wavelength converting element 30. Both portions 43 and 44 of sidewall(s) 41 are substantially vertical in the embodiment illustrated in FIG. 7. The area of the top, light extraction surface 35 is greater than the area of the bottom surface 40 of wavelength converting element 30.

In the device of FIG. 8, a bottom portion 45 of the wavelength converting element has sloped sidewall(s), and a top portion 43 of the wavelength converting element 30 has substantially vertical sidewall(s). The area of the top, light extraction surface 35 is greater than the area of the bottom surface 40 of wavelength converting element 30.

FIGS. 9, 10, 11, 12, 13, 14, 15, 16, and 17 are views of different embodiments, illustrating the size, shape, and placement of the light extraction surface 35 of wavelength converting element 30 relative to the light extraction surface 37 of LED 1, when viewed from the top of the device. In each of FIGS. 9, 10, 11, 12, 13, 14, 15, 16, and 17, the area of the light extraction surface 35 of wavelength converting element 30 is smaller than the area of the light extraction surface 37 of LED 1. In an actual device according to FIGS. 9, 10, 11, 12, 13, 14, 15, 16, and 17, the portions of the LEDs visible in the figures would be covered by reflective material 34, as illustrated in the cross sections of FIGS. 1, 4, 5, 6, 7, and 8.

Figure 9:
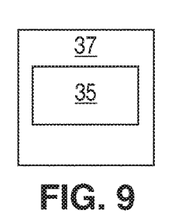
FIGS. 9, 10, 11, 12, 13, 14, 15, 16, and 17 illustrate the light output surfaces of the LED and wavelength converting elements of different shapes, according to some embodiments.

In FIG. 9, the top surface 35 of the wavelength converting element is rectangular and is centered on the light extraction surface 37 of LED 1. In this example and the examples of FIGS. 9, 10, 13, 14, 15, 16, and 17, the wavelength converting element 30 has four sidewalls.

Figure 10:
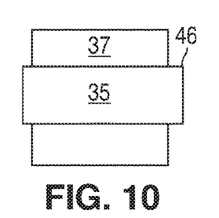

In FIG. 10, the top surface 35 of the wavelength converting element is rectangular. It is centered on light extraction surface 37 of LED 1, but overhangs the sides of the light extraction surface 37 of LED 1 in regions 46.

Figure 11:
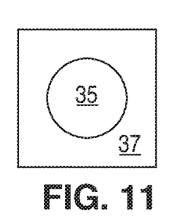

In FIG. 11, the top surface 35 of the wavelength converting element is circular. The wavelength converting element is centered on the light extraction surface 37 of LED 1. In this example the wavelength converting element 30 has a single sidewall.

Figure 12:
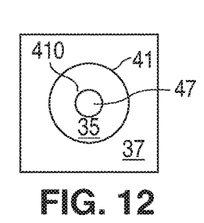

In FIG. 12, the top surface 35 of the wavelength converting element is circular. A circular hole 47 is formed in the center of the wavelength converting element and extends through the entire thickness of the wavelength converting element, exposing the light extraction surface 37 of LED 1. The wavelength converting element is centered on the light extraction surface 37 of LED 1.

The embodiment illustrated in FIG. 12 is not limited to a circular wavelength converting element with a circular hole 47. Both the wavelength converting element and the hole may be any suitable shape and need not be the same shape. The hole need not be centered in the wavelength converting element as illustrated, and the wavelength converting element need not be centered on the LED as illustrated. In this example the wavelength converting element 30 has a single outer sidewall 41 and a second inner sidewall 410. The angle of the inner and outer sidewalk may be the same or different. For this example, FIGS. 1, 4, 5, 6, 7 and 8 illustrate the shape of the outer sidewall 41 and do not show the inner sidewall 410.

Figure 13:
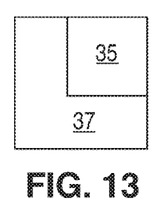

In FIG. 13, the top surface 35 of the wavelength converting element is square, but the wavelength converting element is positioned in a corner of the light extraction surface 37 of LED 1, rather than centered over the light extraction surface 37. Two of the edges of the top surface 35 of the wavelength converting element align with two of the edges of the light extraction surface 37, though strict alignment is not required.

Figure 14:
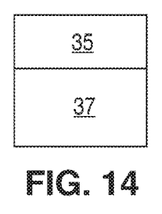

In FIG. 14, the top surface 35 of the wavelength converting element is rectangular, but the wavelength converting element is positioned off center. One or more edges of the wavelength converting element are aligned with an edge of the light extraction surface 37 of LED 1, rather than centered over the light extraction surface 37, though strict alignment is not required.

Figure 15:
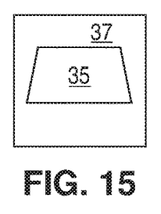

In FIG. 15, the top surface 35 of the wavelength converting element is trapezoidal. Although the figure shows the cross section of an isosceles trapezoid, other trapezoids are contemplated and are included within the scope of the invention.

Figure 16:
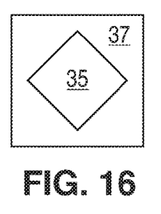

In FIG. 16, the top surface 35 of the wavelength converting element is square and centered over the light extraction surface 37, but with the edges of the wavelength converting element oriented at 45 degrees relative to the edges of the light extraction surface, rather than parallel, such that the wavelength converting element appears as a diamond. Other orientations of the square or of any cross section shape are also contemplated and are included within the scope of the invention.

Figure 17:
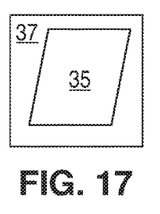

In FIG. 17, the top surface 35 of the wavelength converting element is a parallelogram.

Other cross sections and top views are possible. The shape of the wavelength converting element 30 is not limited to the examples illustrated.

Figure 18:
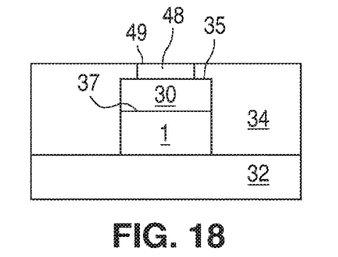
FIG. 18 is a cross sectional view of a device including an LED, wavelength converting element, and transparent structure which may reduce the light output area and thereby increase luminance.

In some embodiments, the area of the surface from which light is extracted from the device is made smaller than the area of the surface from which light is extracted from the LED by disposing an additional optical element disposed over the wavelength converting element, rather than by the wavelength converting element itself. Such a device is illustrated in FIG. 18. An LED 1 is attached to a support 32 and a wavelength converting element 30 is attached to the LED as described above. The wavelength converting element 30 is the same size as LED 1 in the embodiment illustrated, though this is not required. A transparent structure 48 is disposed over wavelength converting element 30. Reflective material 34 is disposed on the sides of the transparent structure 48, the wavelength converting element 30, and the LED 1. The transparent structure 48 may be, for example, glass, sapphire, silicone, epoxy, GaN, SiC, plastic, or any other suitable transparent material. It is formed on or attached to wavelength converting element 30 by any suitable technique including, for example, gluing with a silicone adhesive, before forming reflective material 34, as described above. The area 49 of the top, light extraction surface of the transparent structure 48 is smaller than the light extraction surface 35 of the wavelength converting element 30 and the light extraction surface 37 of LED 1, which may increase the luminance of the structure.

FIGS. 19, 20, 21, 22, and 23 are top views illustrating embodiments where a single wavelength converting element is disposed over multiple LEDs 1a, 1b, 1c, and 1d. In each case, the area of the light extraction surface 35 of the wavelength converting element 30 is smaller than the combined area of the light extraction surfaces 37 of the LEDs 1a-d, and the area between the LEDs 1a-d. The light extraction surface 35 area of the wavelength converting element 30 may be no more than 90% of the combination of the sum of the areas of the light output surfaces of the LEDs 1a-d and the area between the LEDs 1a-d in some embodiments, no more than 80% in some embodiments, no more than 60% in some embodiments, at least 30% in some embodiments, and at least 50% in some embodiments.

In embodiments with a wavelength converting element disposed over multiple LEDs, the shape of the light emitting area can be changed arbitrarily by changing the arrangement of the LEDs. In effect, in the embodiments of FIGS. 19, 20, 21, 22, and 23, group of LEDs substitutes for the single LEDs illustrated in FIGS. 1 and 3-18. In particular, the devices illustrated in FIGS. 1 and 3-18 may be made by placing a wavelength converting element over a single 1 mm² die, or over four 0.25 mm² dies. Using multiple LEDs instead of a single LED gives freedom in terms of optical shape, drive current/voltage, reuse of a single die for different size parts (for manufacturing simplicity) and allows for individual addressability of the LEDs (turn on one part of the structure at a time).

FIGS. 19, 20, 21, 22, and 23 illustrate the relative arrangement of the LEDs and the wavelength converting element. In an actual device according to FIGS. 19, 20, 21, 22, and 23, the portions of the LEDs visible in the figures would be covered by reflective material 34, as illustrated in the cross sections of FIGS. 1, 4, 5, 6, 7, and 8. In the embodiments illustrated in FIGS. 19, 20, 21, 22, and 23, the wavelength converting element covers at least a portion of all of the LEDs in the group. More or fewer LEDs may be used in any of the embodiments illustrated.

Figure 19:
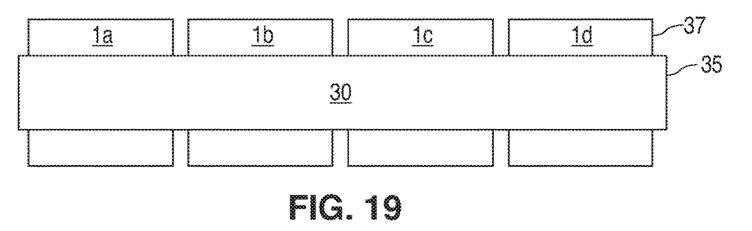
FIG. 19 illustrates the light output surfaces of a line of four LEDs and a shared wavelength converting element.

In FIG. 19, a wavelength converting element 30 with a rectangular top surface 35 is disposed over a line of four LEDs 1a, 1b, 1c, and 1d. The top surface 35 of wavelength converting element 30 is narrower than the LEDs, such that portions of each of the LEDs 1a, 1b, 1c, and 1d are not covered by the wavelength converting element. As illustrated in FIG. 19, the sides of the wavelength converting element 30 extend beyond the edges of LEDs 1a and 1d. This is not required; in some embodiments, the wavelength converting element does not extend beyond the edges of the LEDs in any dimension.

Figure 20:
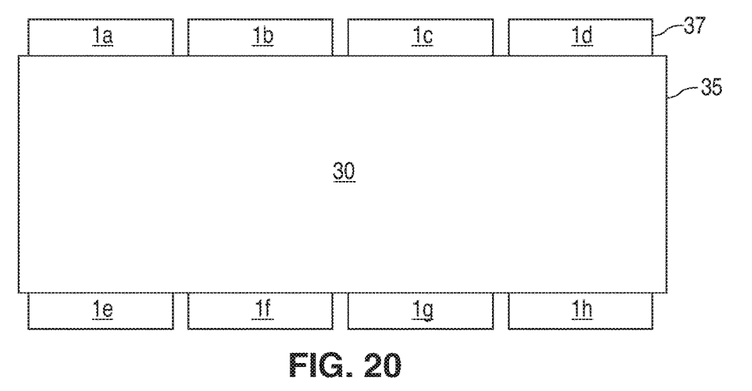
FIG. 20 illustrates the light output surfaces of a two by four array of LEDs and a shared wavelength converting element.

In FIG. 20, a wavelength converting element 30 with a rectangular top surface 35 is disposed over a 2×4 array of eight LEDs 1a, 1b, 1c, 1d, 1e, 1f, 1g, and 1h. The top surface 35 of wavelength converting element 30 is narrower than the array of LEDs, such that portions of each of the LEDs 1a, 1b, 1c, 1d, 1e, 1f, 1g, and 1h are not covered by the wavelength converting element 30.

Figure 21:
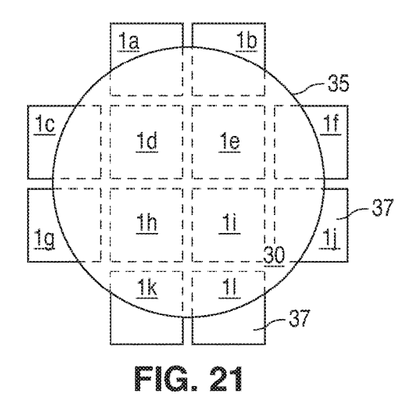
FIG. 21 illustrates the light output surfaces of an arrangement of twelve LEDs and a shared wavelength converting element.

In FIG. 21, a wavelength converting element 30 with a circular top surface 35 is disposed over an array of 12 LEDs 1a, 1b, 1c, 1d, 1e, 1f, 1g, 1h, 1i, 1j, 1k, and 1l arranged like a plus sign. The middle four LEDs 1d, 1e, 1h, and 1i are completely covered by wavelength converting element 30. Portions of LEDs 1a, 1b, 1c, 1f, 1g, 1j, 1k, and 1l are not covered by the wavelength converting element 30. The embodiment illustrated in FIG. 21 is a square array of LEDs covered by a round wavelength converting element. LEDs in the array that are not covered by the round wavelength converting element are removed, resulting in the plus-sign shaped array illustrated. The embodiment illustrated may be extended to any device where the wavelength converting element is a shape that does not readily correspond to a rectangular array of rectangular LEDs.

Figure 22:
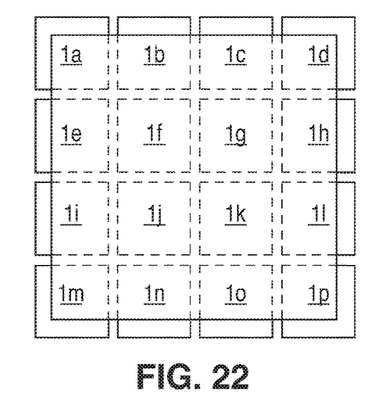
FIG. 22 illustrates the light output surfaces of a four by four array of LEDs and a shared wavelength converting element.

In FIG. 22, a wavelength converting element 30 with a rectangular top surface 35 is disposed over a 4×4 array of 16 LEDs 1a, 1b, 1c, 1d, 1e, 1f, 1g, 1h, 1i, 1j, 1k, 1l, 1m, 1n, 1o, and 1p. The top surface 35 of wavelength converting element 30 is smaller than the array of LEDs, such that portions of the LEDs on the outside of the array, LEDs 1a, 1b, 1c, 1d, 1e, 1h, 1i, 1l, 1m, 1n, 1o, and 1p are not covered by the wavelength converting element 30. The LEDs in the center of the array, LEDs 1f, 1g, 1j, and 1k are completely covered by the wavelength converting element.

Figure 23:
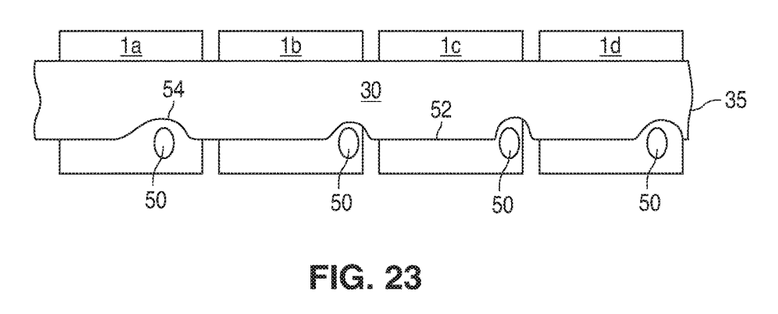
FIG. 23 illustrates the light output surfaces of a line of four LEDs and a shared wavelength converting element, where the wavelength converting element is shaped to accommodate bonding structures on the light output surfaces of the LEDs.

FIG. 23 illustrates a wavelength converting element 30 with a substantially rectangular top, light extraction surface 35 disposed over a line of four LEDs 1a, 1b, 1c, and 1d. One edge 52 of the light extraction surface 35 has regions 54 that are shaped to accommodate bonding structures 50 formed on the light extraction surfaces 37 of each of the LEDs 1a, 1b, 1c, and 1d. Though the bonding structures 50 illustrated are wire bonds, they may be any suitable bonding structure. Any of the wavelength converting elements described above may be shaped such that they do not cover or otherwise interfere with a bonding structure or any other structure formed the light extraction surface of the LED, as illustrated in FIG. 23. The wavelength converting element illustrated may be readily formed by tapecasting, in which the regions 54 may be easily formed, or by any other suitable method.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
   a light emitting semiconductor structure comprising a light emitting layer and having a first light extraction surface with a first area;
   a wavelength converting element disposed over the light emitting semiconductor structure and over the first light extraction surface, the wavelength converting element having a second light extraction surface with a second area, the second area being smaller than the first area;
   a transparent structure disposed over the wavelength converting element and over the second light extraction surface, the transparent structure having a third light extraction surface with a third area, the third area being smaller than the second area; and
   a reflective material in contact with sidewalls of the light emitting layer, wavelength converting element, and transparent structure, the reflective material also disposed over an exposed portion of the first light extraction surface and the second light extraction surface.

2. The device of claim 1, wherein the wavelength converting element has sloped sidewalls.

3. The device of claim 1, wherein:
the second light extraction surface is a first surface of the wavelength converting element;
the wavelength converting element comprises a second surface, wherein the second surface of the wavelength converting element is closer to the first light extraction surface than the first surface of the wavelength converting element; and
the second surface has a larger area than the first surface.

4. The device of claim 1, wherein:
the second light extraction surface is a first surface of the wavelength converting element;
the wavelength converting element comprises a second surface, wherein the second surface of the wavelength converting element is closer to the first light extraction surface than the first surface of the wavelength converting element; and
the second surface has a smaller area than the first surface.

5. The device of claim 1, wherein the wavelength converting element is centered over the first light extraction surface.

6. The device of claim 1, wherein the wavelength converting element is off center relative to the first light extraction surface.

7. The device of claim 1 wherein the second area is no more than 90% of the first area.

8. The device of claim 1 wherein
the wavelength converting element is fabricated separately from the light emitting semiconductor structure; and
the wavelength converting element is attached to the light emitting semiconductor structure.

9. A device comprising:
a plurality of light emitting semiconductor structures each having a light emitting layer and light extraction surface;
a wavelength converting element disposed over only a portion of at least two of the first light extraction surfaces, the wavelength converting element having a second light extraction surface such that
an area of the second light extraction surface is smaller than an area that is the sum of the areas of each of the first light extraction surfaces in the plurality of light emitting semiconductor structures and an area between the plurality of light emitting semiconductor structures;
a transparent structure disposed over the wavelength converting element and over the second light extraction surface, the transparent structure having a third light extraction surface with a third area, the third area being smaller than the second area; and
a reflective material in contact with sidewalls of the light emitting layers of the plurality of light emitting semiconductor structures, the wavelength converting element, and the transparent structure, the reflective material also disposed over an exposed portion of the first light extraction surface and the second light extraction surface.

10. The device of claim 9 wherein the plurality of light emitting semiconductor structures are arranged in an array.

11. The device of claim 9 wherein the area of the second light extraction surface is no more than 90% of the area that is a sum of the areas of each of the first light extraction surfaces in the plurality and an area between the light emitting semiconductor structures in the plurality.

12. A device comprising:
a semiconductor light emitting structure having a light emitting layer and having a first light extraction surface;
a wavelength converting element disposed on the semiconductor light emitting structure, a top surface of the wavelength converting layer having a substantially same area as the first light extraction surface; and
a second structure disposed on the wavelength converting element above the first light extraction surface, the second structure having a second light extraction surface;
a surface area of the second light extraction surface being less than the top surface of the wavelength converting layer; and
reflective material disposed along the sidewalls of the light emitting layer, the wavelength converting element, and the second structure as well as any exposed portion of the first light extraction surface and the wavelength converting element.

13. The device of claim 12 wherein the second structure is a transparent material.

* * * * *